US011288478B2

(12) United States Patent
Liu et al.

(10) Patent No.: US 11,288,478 B2
(45) Date of Patent: Mar. 29, 2022

(54) FINGERPRINT IDENTIFICATION MODULE, MANUFACTURING METHOD AND DRIVING METHOD THEREOF, AND DISPLAY DEVICE

(71) Applicant: BOE Technology Group Co., Ltd., Beijing (CN)

(72) Inventors: Yingming Liu, Beijing (CN); Haisheng Wang, Beijing (CN); Xiaoliang Ding, Beijing (CN); Xiufeng Li, Beijing (CN); Pengpeng Wang, Beijing (CN); Chenyang Zhang, Beijing (CN); Yaqian Ji, Beijing (CN); Peixiao Li, Beijing (CN); Jing Liu, Beijing (CN); Ruituo Wang, Beijing (CN); Lei Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 244 days.

(21) Appl. No.: 16/639,309

(22) PCT Filed: Sep. 17, 2019

(86) PCT No.: PCT/CN2019/106239
§ 371 (c)(1),
(2) Date: Feb. 14, 2020

(87) PCT Pub. No.: WO2020/155647
PCT Pub. Date: Aug. 6, 2020

(65) Prior Publication Data
US 2020/0372231 A1 Nov. 26, 2020

(30) Foreign Application Priority Data

Jan. 28, 2019 (CN) .......................... 201910081953.8

(51) Int. Cl.
*G06K 9/00* (2006.01)
*H01L 41/18* (2006.01)
*G06F 3/01* (2006.01)

(52) U.S. Cl.
CPC ........... *G06K 9/0002* (2013.01); *G06F 3/017* (2013.01); *H01L 41/18* (2013.01)

(58) Field of Classification Search
CPC ....... G06K 9/0002; G06F 3/017; H01L 41/18; H01L 41/193
See application file for complete search history.

(56) References Cited

U.S. PATENT DOCUMENTS

| 7,400,750 | B2 * | 7/2008 | Nam ..................... G06K 9/0002 |
| | | | 382/124 |
| 2012/0206014 | A1 * | 8/2012 | Bibl ...................... B06B 1/0207 |
| | | | 310/331 |

(Continued)

*Primary Examiner* — Jonathan A Boyd
(74) *Attorney, Agent, or Firm* — Arent Fox LLP; Michael Fainberg

(57) ABSTRACT

A fingerprint identification module, a manufacturing method and driving method thereof, and a display device. The fingerprint identification module includes: a driving backplate, including a substrate, identification circuits on the substrate, the identification circuits having a first electrode pad, a second electrode pad; acoustic units including: a first electrode; a piezoelectric film layer positioned on the side, close to the driving backplate, of the first electrode; a second electrode positioned on the side, close to the driving backplate, of the piezoelectric film layer; a first lead-out terminal electrically connected with the first electrode; a second lead-out terminal electrically connected with the second electrode; cavities being in one-to-one correspondence to the acoustic units, the cavities positioned between the second electrodes and the substrate, and one side face, away from the substrate, of cavity being defined by at least one side face, close to the substrate, of the second electrode.

20 Claims, 30 Drawing Sheets

(56) References Cited

U.S. PATENT DOCUMENTS

| | | | |
|---|---|---|---|
| 2013/0210175 A1* | 8/2013 | Hoisington | B41J 2/1631 438/21 |
| 2014/0145244 A1* | 5/2014 | Dan | B81C 3/001 257/254 |
| 2014/0232241 A1* | 8/2014 | Hajati | B81B 7/02 310/317 |
| 2015/0165479 A1* | 6/2015 | Lasiter | G06F 3/0412 310/322 |
| 2017/0110504 A1* | 4/2017 | Panchawagh | H01L 41/311 |
| 2018/0107854 A1* | 4/2018 | Tsai | B06B 1/067 |
| 2018/0191322 A1* | 7/2018 | Chang | H03H 9/132 |
| 2018/0369866 A1* | 12/2018 | Sammoura | G06K 9/0002 |

* cited by examiner

FINGERPRINT IDENTIFICATION MODULE, MANUFACTURING METHOD AND DRIVING METHOD THEREOF, AND DISPLAY DEVICE

This application is a National Stage of International Application No. PCT/CN2019/106239, filed on Sep. 17, 2019, which claims the priority of a Chinese patent application filed in the China National Intellectual Property Administration on Jan. 28, 2019 with the application number of 201910081953.8 and the disclosure name of "Fingerprint Identification Module, Manufacturing Method and Driving Method thereof and Display Device", the entire contents of which are hereby incorporated by reference.

FIELD

The disclosure relates to the technical field of display, in particular to a fingerprint identification module and a manufacturing method and driving method thereof and a display device.

BACKGROUND

With the rapid development of economy and science and technology, the full screen puts forward a new requirement for fingerprint identification that is to capture fingerprints at any position of a display panel, so that the front glass does not need to be perforated anymore, and the appearance consistency of a mobile phone is greatly improved. At present, there are two technical directions to realize this requirement, one is optical fingerprint identification and the other is ultrasonic fingerprint identification.

SUMMARY

The disclosure provides a fingerprint identification module, including:

a driving backplate, including a substrate and a plurality of identification circuits positioned on the substrate, the identification circuits having a first electrode pad and a second electrode pad;

a plurality of acoustic units, the acoustic units being in one-to-one correspondence to the identification circuits, and the acoustic units including: a first electrode; a piezoelectric film layer positioned on the side, close to the driving backplate, of the first electrode; a second electrode positioned on the side, close to the driving backplate, of the piezoelectric film layer; a first lead-out terminal electrically connected with the first electrode; and a second lead-out terminal electrically connected with the second electrode; the first lead-out terminals being electrically connected with the first electrode pads, and the second lead-out terminals being electrically connected with the second electrode pads; and a plurality of cavities, the cavities being in one-to-one correspondence to the acoustic units, the cavities being positioned between the second electrodes and the substrate, and one side face, away from the substrate, of each cavity being defined by at least one side face, close to the substrate, of the second electrode.

In one possible embodiment, a support portion is arranged between each piezoelectric film layer and the substrate; and in a direction perpendicular to the substrate, the highest height of the cavity is equal to the sum of the heights of the first electrode pad, the first lead-out terminal and the support portion.

In one possible embodiment, the support portion is located between the corresponding piezoelectric film layer and a layer where the corresponding first lead-out terminal is located.

In one possible embodiment, the support portion is located between the substrate and a layer where the first electrode pad is located.

In one possible embodiment, the substrate is provided with grooves, and the side walls of the grooves serve as the support portions.

In one possible embodiment, the side face, away from the substrate, of the cavities is at least defined by the side face, close to the substrate, of the corresponding piezoelectric film layer.

In one possible embodiment, the support portions are annular support portions.

In one possible embodiment, the cavities are filled with air or elastic filler.

In one possible embodiment, the acoustic units further include a through hole penetrating through the corresponding piezoelectric film layer, the through holes are filled with a first connecting portion, and the first lead-out terminals are electrically connected with the corresponding first electrode through the first connecting portion.

In one possible embodiment, a part of the second electrode is reused as the second lead-out terminal, and the first connecting portion, the first lead-out terminal, and the second electrode are disposed on the same layer.

In one possible embodiment, the acoustic units further include an elastic layer located on the side, facing away from the piezoelectric film layer, of the first electrode.

In one possible embodiment, the piezoelectric film layers are an inorganic piezoelectric film layer made of aluminum nitride, zinc oxide or lead zirconate titanate.

In one possible embodiment, the fingerprint identification module further includes a control IC, transmitting traces and receiving traces. The first electrode pads are receiving electrode pads and the second electrode pads are transmitting electrode pads.

The receiving electrode pads are electrically connected with the control IC through thin film transistor switching circuits via the receiving traces, and the transmitting electrode pads are electrically connected with the control IC via the transmitting traces.

Some embodiments of the disclosure also provide a display device, including the fingerprint identification module provided by the embodiments of the disclosure, and further including a display panel;

and the fingerprint identification module is located on a non-display surface of the display panel.

Some embodiments of the present disclosure also provide a manufacturing method of the fingerprint identification module according to the embodiments of the present disclosure, wherein the manufacturing method includes:

forming a driving backplate, wherein the driving backplate includes a substrate and a plurality of identification circuits positioned on the substrate, and the identification circuits have a first electrode pad and a second electrode pad;

forming a plurality of acoustic units on a carrier substrate, wherein the acoustic units include a first lead-out terminal and a second lead-out terminal; and transferring the acoustic units on the carrier substrate to the driving backplate, electrically connecting the first electrode pads with the first lead-out terminals, electrically connecting the second electrode pads with the second lead-out terminals, and forming cavities between second electrodes and the substrate, wherein one side face, away from the substrate, of each cavity is defined by at least one side face, close to the substrate, of the corresponding second electrode.

In one possible embodiment, the forming of the plurality of acoustic units on the carrier substrate includes:

sequentially forming a first electrode and a piezoelectric film layer on the carrier substrate, and forming a through hole in the piezoelectric film layer; and forming the second electrode and the first lead-out terminal on the side, away from the first electrode, of the piezoelectric film layer, wherein the second electrode and the first lead-out terminal do not overlap, and the first lead-out terminal is electrically connected with the first electrode through a first connecting portion filled in the through hole;

wherein the second electrode, the first lead-out terminal and the first connecting portion are formed by a same patterning process.

In one possible embodiment, before the forming the second electrode and the first lead-out terminal on the side, away from the first electrode, of the piezoelectric film layer, the manufacturing method further includes:

forming a support portion on the side, away from the first electrode, of the piezoelectric film layer, so as to form the cavities between the piezoelectric film layers and the driving backplate when the acoustic unit is transferred to the driving backplate.

In one possible embodiment, the forming the driving backplate includes:

before forming the first electrode pads and the second electrode pads on the substrate, forming a plurality of support portions on the substrate, so as to form the cavities between the piezoelectric film layers and the driving backplate when the acoustic units are transferred to the driving backplate.

In one possible embodiment, the forming the driving backplate includes:

forming a plurality of grooves in the substrate, so as to form the cavities between the piezoelectric film layers and the driving backplate when the acoustic units are transferred to the driving backplate; and forming a plurality of identification circuits in other regions of the substrate except regions where the grooves are located.

Some embodiments of the present disclosure also provide a driving method of the fingerprint identification module according to the embodiments of the present disclosure, and the driving method includes:

in a transmitting stage, controlling the first electrode pads to load a first fixed potential and the second electrode pads to load varying electrical signals; and in the receiving stage, converting ultrasonic signals reflected by the finger, through the piezoelectric film layers, into identification electrical signals, controlling the second electrode pads to load a second fixed potential, and receiving, by the first electrode pads, the identification electrical signals;

the controlling the second electrode pads to load the varying electrical signals includes:

sequentially controlling the second electrode pads to load the varying electrical signals; and when the current second electrode pad loads the varying electrical signals, controlling the plurality of adjacent second electrode pads to load the electrical signals before a preset period, so that a plurality of ultrasonic signals correspondingly converted from the plurality of electrical signals are sequentially focused at different positions.

DETAILED DESCRIPTION OF THE EMBODIMENTS

The technical solution in the embodiments of the present disclosure will be clearly and completely described below with reference to the drawings in the embodiments of the present disclosure. Obviously, the described embodiments are only part of the embodiments of the present disclosure, not all of the embodiments. Based on the embodiments in the present disclosure, all other embodiments obtained by those of ordinary skill in the art without creative labor are within the scope of protection of the present disclosure.

Figure 1:
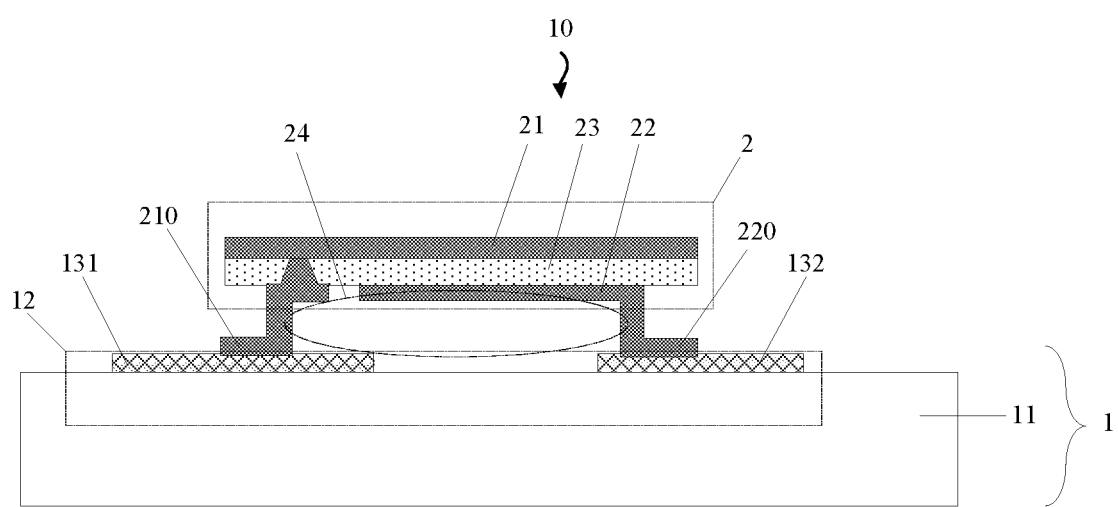
FIG. 1 is a structural diagram of a fingerprint identification module according to the embodiments of the present disclosure.

Referring to FIG. 1, the present disclosure provides a fingerprint identification module 10, including:

a driving backplate 1, including a substrate 11 and a plurality of identification circuits 12 positioned on the substrate 11, each identification circuit 12 having a first electrode pad 131 and a second electrode pad 132;

a plurality of acoustic units 2, the acoustic units 2 being in one-to-one correspondence to the identification circuits 12, and each acoustic unit 2 including: a first electrode 21; a piezoelectric film layer 23 positioned on the side, close to the driving backplate 1, of the first electrode 21; a second electrode 22 positioned on the side, close to the driving backplate 1, of the piezoelectric film layer 23; a first lead-out terminal 210 electrically connected with the first electrode 21; and a second lead-out terminal 220 electrically connected with the second electrode 22; the first lead-out terminals 210 being electrically connected with the first electrode pads 131, and the second lead-out terminals 220 being electrically connected with the second electrode pads 132; and a plurality of cavities 24, the cavities 24 being in one-to-one correspondence to the acoustic units 2, the cavities 24 being positioned between the second electrodes 22 and the substrate 11, and one side face, away from the substrate 11, of each cavity 24 being defined by at least one side face, close to the substrate 11, of the corresponding second electrode 22.

The fingerprint identification module according to the embodiments of the present disclosure includes the driving backplate 1 and the acoustic units 2, wherein the driving backplate 1 includes the first electrode pads 131 and the second electrode pads 132, and each acoustic unit 2 includes the first lead-out terminal 210 electrically connected with the corresponding first electrode 21 and the second lead-out terminal 220 electrically connected with the corresponding second electrode 22, so that only the identification circuits can be formed on a general substrate (e.g., a glass substrate or an organic substrate), and the acoustic units 2 having the piezoelectric film layers can be formed on a specific substrate (e.g., a silicon-based substrate) with high temperature tolerance. Since the specific substrate has high temperature tolerance, the piezoelectric film layers can be formed by a high temperature process (e.g., chemical vapor deposition), and then by transfer-printing the acoustic units 2 formed on the specific substrate to the driving backplate 1 including the general substrate and the identification circuits, electrically connecting the first electrode pads 131 of the driving backplate 1 with the first leading-out ends 210 of the acoustic units 2, and electrically connecting the second electrode pads 132 of the driving backplate 1 with the second leading-out ends 220 of the acoustic units 2, the acoustic units 2 with the piezoelectric film layers are formed on the general substrate; moreover, the cavities 24 are further formed between the second electrodes 22 and part of the driving backplate 1, and when the acoustic units 2 transmit or receive acoustic signals, the cavities 24 can vibrate together with the piezoelectric film layers 23, so that the transmitted or received acoustic signals can be strengthened, and the accuracy of fingerprint identification can be improved.

For traditional ultrasonic fingerprint identification, an ultrasonic fingerprint identification device with a poly vinylidene fluoride (PVDF) piezoelectric film layer can be directly manufactured on a glass substrate. Ultrasonic signals emitted by the ultrasonic identification device using this piezoelectric material are weak, resulting in weak reflected ultrasonic signals, thus affecting the accuracy of fingerprint identification. In contrast, an ultrasonic fingerprint identification device formed by an inorganic piezoelectric film layer can emit strong ultrasonic signals, but the inorganic piezoelectric film layer generally requires a high manufacturing temperature and cannot be directly manufactured on a general substrate (such as a glass substrate or an organic substrate), for example, the inorganic piezoelectric film layer needs to be formed at a temperature of more than 1000 DEG C., but the melting temperature of the glass substrate is 600 DEG C., that is why the inorganic piezoelectric film layer cannot be directly manufactured on the general substrate. However, in the embodiments of the present disclosure, the substrate 11 of the driving backplate 1 may be a glass substrate. In order to realize high intensity of ultrasonic emission signals and accurate fingerprint identification performance, it is optionally that the piezoelectric film layer 23 in the embodiments of the present disclosure may be an inorganic piezoelectric film layer, and the material of the inorganic piezoelectric film layer may be aluminum nitride, zinc oxide or lead zirconate titanate. Of course, the piezoelectric film layer in the embodiments of the present disclosure may also be PVDF if the intensity of ultrasonic signals and the recognition accuracy are not considered.

During specific implementation, as shown in FIGS. 2-5, a support portion 25 is arranged between the piezoelectric film layer 23 and the substrate 11; and in a direction perpendicular to the substrate 11, the highest height of the cavity 24 is equal to the sum of the heights of the first electrode pad 131, the first lead-out terminal 210, and the support portion 25, that is, the highest height d of the cavity 24 is equal to the sum of the height d1 of the first electrode pad 131, the height d2 of the first lead-out terminal 210, and the height d3 of the support portion 25.

How the cavities 24 are formed by the support portions 25 will be described in detail by way of example as follows.

Figure 2:
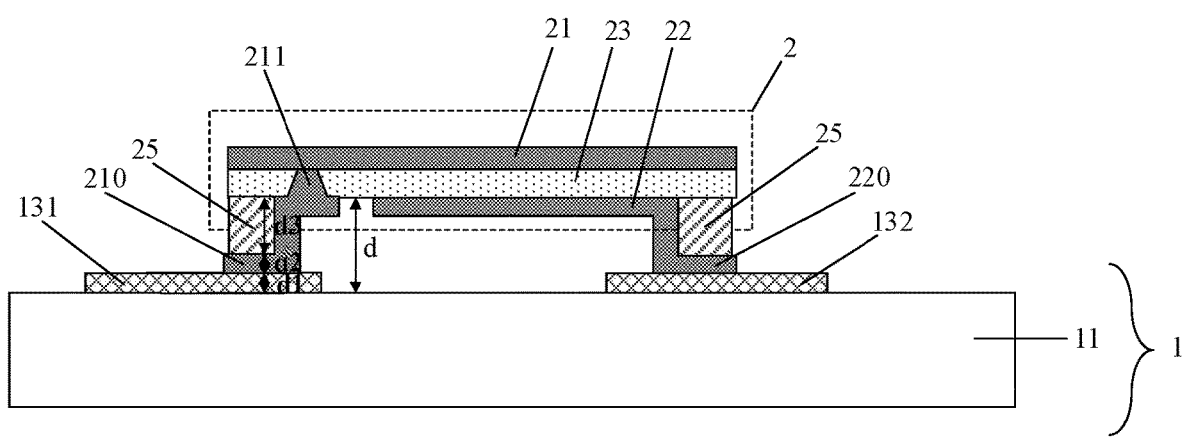
FIG. 2 is a structural diagram of a fingerprint identification module provided with support portions in acoustic units according to the embodiments of the present disclosure.
Figure 3:
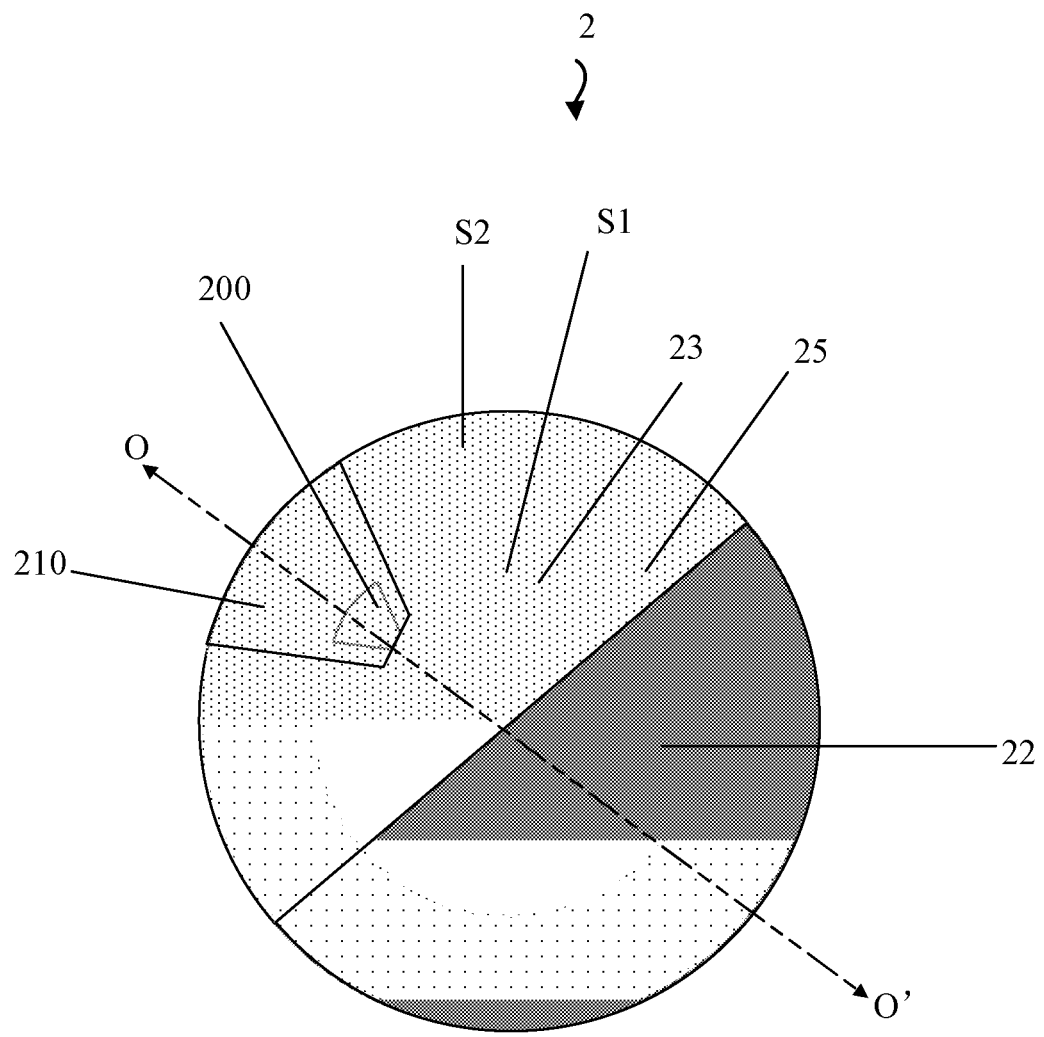
FIG. 3 is a top view of an acoustic unit according to the embodiments of the present disclosure.

For example, referring to FIGS. 2 and 3, wherein FIG. 2 can be a cross-sectional view of FIG. 3 along OO'. The support portion 25 is located between the corresponding piezoelectric film layer 23 and a layer where the corresponding first lead-out terminal 210 is located. That is, the support portions 25 are formed when forming the acoustic units 2. Each acoustic unit 2 includes a central region S1 and an edge region S2 surrounding the central region S1. The annular support portion 25 (the oblique line region in FIGS. 2 and 3) are arranged between the piezoelectric film layer 23 (the sparse dot region in FIGS. 2 and 3) and the substrate 11, the front projection of the support portion 25 on the substrate 11 overlaps with the front projection of the edge region S2 on the substrate 1, and the support portion 25 allows the cavity 24 to be formed in the central region S1 by the second electrode 22 (the dense dot region in FIGS. 2 and 3) and part of the driving backplate 1 opposite thereto. Each support portion 25 is located in the corresponding acoustic unit 2, and is specifically located between the corresponding piezoelectric film layer 23 of the acoustic unit 2 and the layer where the corresponding first lead-out terminal 210 is located. During specific fabrication, after the patterned piezoelectric film layers 23 are fabricated, the annular support portions 25 may be formed on the inorganic piezoelectric film layers 23, and then the second electrodes 22 and the first lead-out terminals 210 may be formed on the support portions 25 by a same patterning process. In the embodiments of the present disclosure, the support portions 25 are located in the acoustic units 2, and the manufacturing of the support portions 25 can be realized only by patterning the film layers. When the acoustic units 2 are transfer-printed to the driving backplate 1, as the support portions 25 are only located in the edge regions S2, by making the distance between the central regions S1 of the acoustic units 2 and the driving backplate 1 larger than the distance between the edge regions S2 and the driving backplate 1, the cavities 24 can be directly formed by the acoustic units 2 and the driving backplate 1 after transfer-printing, thus realizing easy formation of the cavities 24. The material of the support portions 25 may be silicon, silicon oxide or silicon nitride. Specifically, each acoustic unit 2 further includes a through hole 200 penetrating through the corresponding piezoelectric film layer 23, and each first lead-out terminal 210 is electrically connected with the corresponding first electrode 21 through the corresponding through hole 200.

Figure 4:
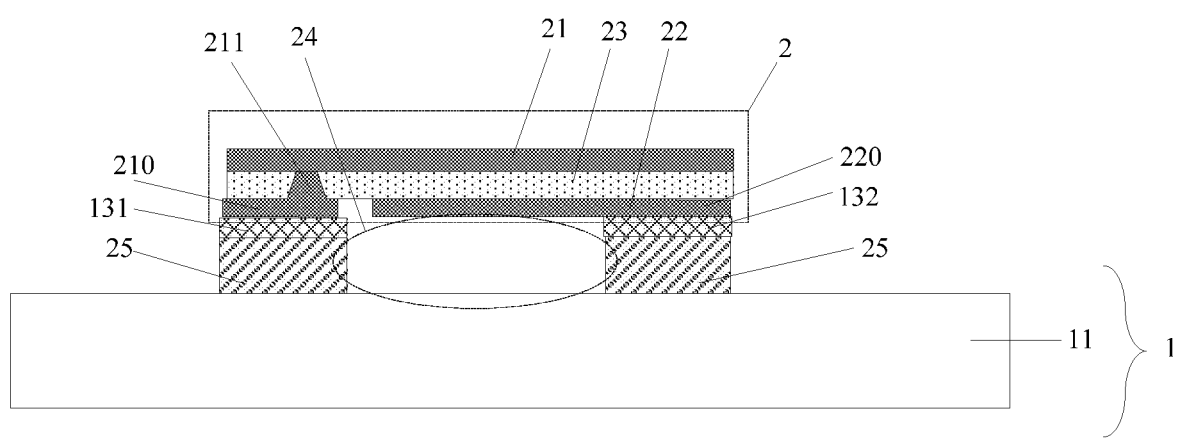
FIG. 4 is a structural diagram of a fingerprint identification module provided with support portions on a driving backplate according to the embodiments of the present disclosure.

As another example, as shown in FIG. 4, by forming the support portions 25 on the driving backplate 1, specifically, the support portions 25 are located on the driving backplate 1 and each support portion 25 is located between the substrate 11 and the layer where the corresponding first electrode pad 131 is located, during specific fabrication, the support portion 25 may be fabricated before the first electrode pad 131 is fabricated on the substrate 11, and then the first electrode pad 131 and the second electrode pad 132 are formed. The first electrode pads 131 and the second electrode pads 132 may be specifically formed by a thin film through a same patterning process. In the embodiments of the present disclosure, the support portions 25 located on the driving backplate 1 are stable. Compared with the support portions 25 located on the acoustic units 2, the situation that the support portions 25 may be susceptible to damage in the transfer-printing process, resulting in failure to form the cavities 24 can be avoided.

Figure 5:
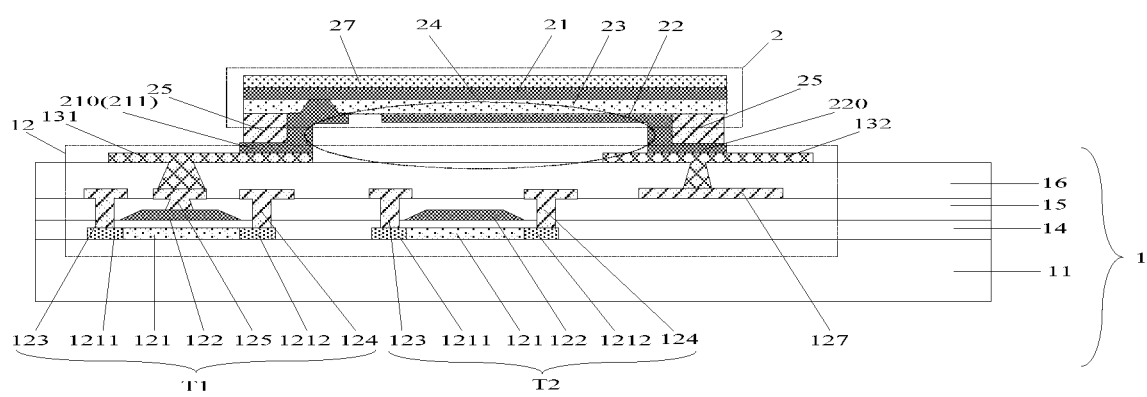
FIG. 5 is a structural diagram of a fingerprint identification module provided with grooves in a driving backplate according to the embodiments of the present disclosure.

As another example, as shown in FIG. 5, the cavities 24 are formed by forming grooves in the driving backplate 1, specifically, the substrate 11 is provided with grooves, and the side walls of the grooves serve as the support portions. The driving backplate 1 is provided with the grooves in an area opposite to the cavities 24, and the grooves allow the cavities 24 to be formed between the second electrodes 22 and part of the driving backplate 1 opposite thereto. During specific implementation, the grooves may be formed by a certain film layer of the driving backplate 1 (for example, by an insulating layer in the process of manufacturing the identification circuits), or may be directly etched on the substrate 11 of the driving backplate 1, and finally formed on the side, facing the second electrodes 22, of the driving backplate 1. In the embodiments of the present disclosure, compared with the cavities 24 formed by the protruding support portions 25, the cavities 24 formed by the grooves have the advantage that when the first lead-out terminal 210 and the second lead-out terminal 220 of each acoustic unit 2 are aligned with the corresponding first electrode pad 131 and the corresponding second electrode pad 132 of the driving backplate 1 respectively, the shape of the grooves is not easily affected, so the success rate of forming the cavities 24 can be improved.

Optionally, as shown in FIG. 5, when the grooves are formed on the driving backplate 1, the front projections of the first electrode pads 131 on the substrate 11 and the front projections of the second electrode pads 132 on the substrate 11 are located on opposite sides of the front projections of the grooves on the substrate 11 respectively. In the embodiments of the present disclosure, the first electrode pads 131 and the second electrode pads 132 are located on the two sides of the grooves, which can avoid the problem that when the first electrode pads 131 and the second electrode pads 132 are located in the grooves, the aligned electrical connection between the first lead-out terminals 210 and the second lead-out terminals 220 of the acoustic units 2 and the first electrode pads 131 and the second electrode pads 132 is hard to realize.

During specific implementation, as shown in FIGS. 2-5, the side face, away from the substrate 11, of each cavity 24 is at least defined by the side face, close to the substrate 11, of the corresponding piezoelectric film layer 23.

During specific implementation, as shown in FIG. 3, the support portions 25 are annular support portions.

During specific implementation, the cavities 24 are filled with air or elastic filler. When the cavities 24 are filled with elastic filler, the stability of the cavities 24 can be improved.

During specific implementation, referring to FIGS. 1-5, each acoustic unit 2 further includes a through hole 200 penetrating through the corresponding piezoelectric film layer 23, each through hole 200 is filled with a first connecting portion 211, and each first lead-out terminal 210 is electrically connected with the corresponding first electrode 21 through the corresponding first connecting portion 211. When the support portions 25 are located in the acoustic units 2, as shown in FIG. 2, the first lead-out terminals 210 may cover part of the surfaces, close to the driving backplate 1, of the support portions 25. When the support portions 25 are located on the driving backplate 1, as shown in FIG. 4, the first lead-out terminals 210 may cover part of the surfaces, close to the driving backplate 1, of the piezoelectric film layers 23. In addition, it should be noted that each first lead-out terminal 210 and the corresponding second electrode 22 are located on the same layer, specifically, the first lead-out terminal 210 and the second electrode 22 can be formed in a same patterning process through a thin film during fabrication. In the embodiments of the present disclosure, each acoustic unit 2 further includes the first connecting portion 211 and the first lead-out terminal 210, that is, the first electrode 21 located on the side, away from the driving backplate 1, of the piezoelectric film layer 23 can be led to the side close to the driving backplate 1 through the first connecting portion 211 and the first lead-out terminal 210, so that signals can be provided for the first electrode 21 through the identification circuits of the driving backplate 1.

During specific implementation, as shown in FIGS. 1-5, part of the second electrode 22 is also used as the second lead-out terminal 220, and the first connecting portion 211, the first lead-out terminal 210, and the second electrode 22 are disposed on the same layer. It should be noted that the first connecting portion 211, the first lead-out terminal 210 and the second electrode 22 are disposed on the same layer. Specifically, it can be understood that the three are formed by a same patterning process. When the support portions 25 are located in the acoustic units 2, as shown in FIG. 2, each second electrode 22 may be a bent layer, including a first overlapping portion covering part of the corresponding piezoelectric film layer 23, a second overlapping portion covering part of the corresponding support portion 25, and a bent portion connecting the first overlapping portion with the second overlapping portion, wherein the second overlapping portion may serve as the second lead-out terminal 220. When the support portions 25 are located at the driving backplate 1, as shown in FIG. 4, each second electrode 22 is a flat layer, and part of the second electrode 22 located at the edge region S2 of the corresponding acoustic unit 2 is in direct contact with the corresponding second electrode pad 132.

Figure 6:
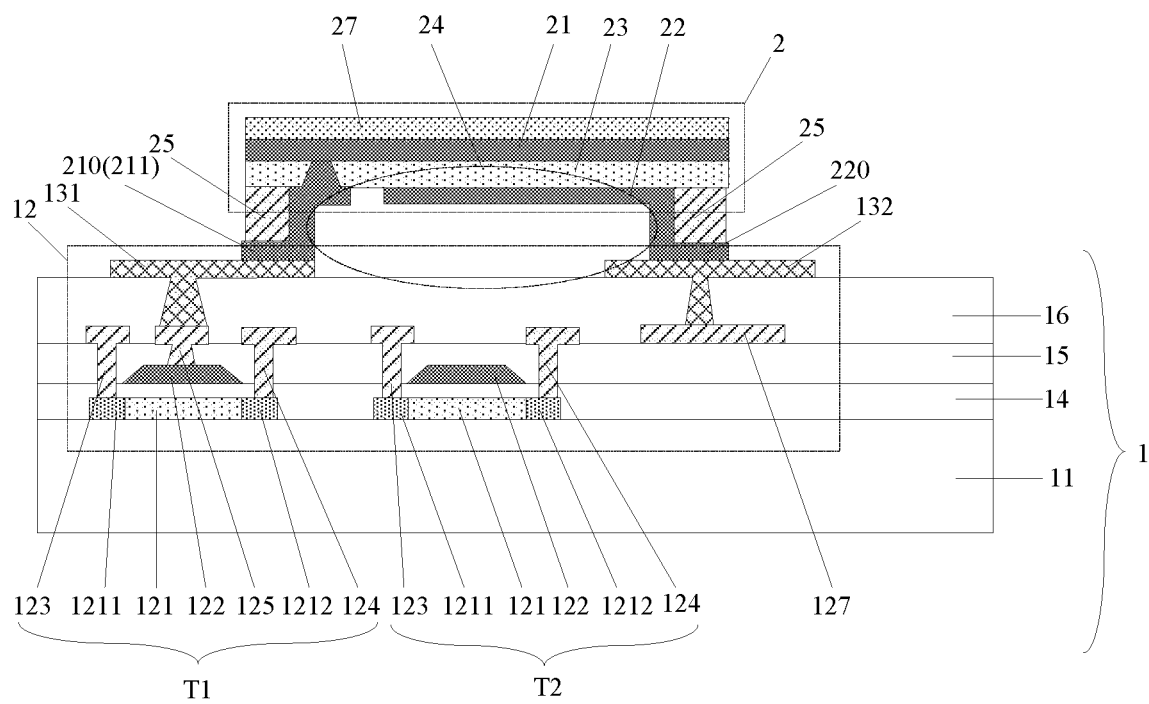
FIG. 6 is a structural diagram of a specific fingerprint identification module according to the embodiments of the present disclosure.

During specific implementation, referring to FIG. 6, each acoustic unit 2 further includes an elastic layer 27 located on the side, facing away from the corresponding piezoelectric film layer 23, of the corresponding first electrode 21. In the embodiments of the present disclosure, each acoustic unit 2 further includes the elastic layer 27 located on the side, facing away from the corresponding piezoelectric film layer 23, of the corresponding first electrode 21. When the acoustic units 2 transmit or receive acoustic wave signals, the elastic layers 27 can vibrate together with the piezoelectric film layers 23, so that the transmitted or received acoustic wave signals can be strengthened, and the accuracy of fingerprint identification can be further improved. The material of the elastic layers may be silicon.

Figure 7:
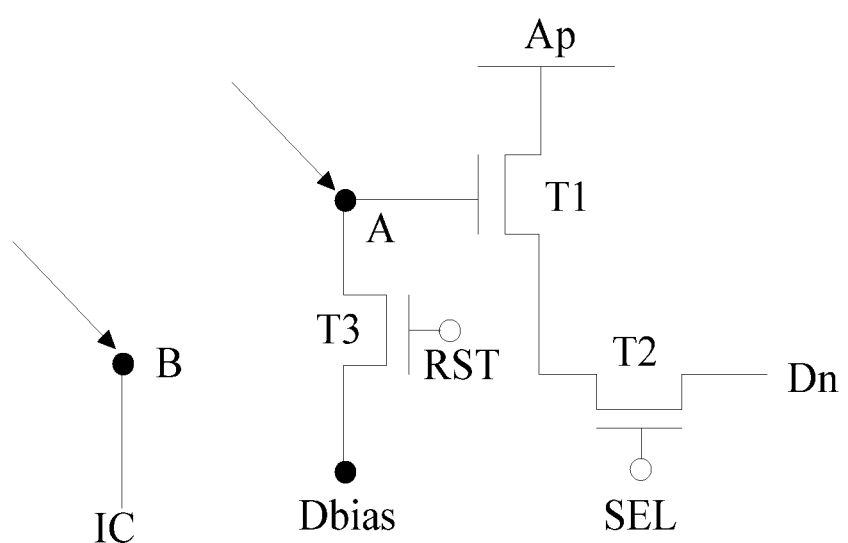
FIG. 7 is a structural diagram of an identification circuit according to the embodiments of the present disclosure.

Optionally, as shown in FIGS. 6 and 7, each identification circuit further includes a thin film transistor switching circuit 120, and FIG. 7 is an equivalent circuit diagram of the thin film transistor switching circuit 120, including a first transistor T1, a second transistor T2 and a third transistor T3;

wherein a gate of the first transistor T1 is electrically connected with a receiving electrode pad (the first electrode pads 131 are receiving electrode pads, the second electrode pads 132 are transmitting electrode pads), and a source of the third transistor T3 is electrically connected at a point A in FIG. 7, a source of the first transistor T1 is electrically connected with a first signal end AP, and a drain of the first transistor T1 is electrically connected with a source of the second transistor T2;

a gate of the second transistor T2 is electrically connected with a second signal end SEL, and a drain of the second transistor T2 is electrically connected with a signal readout end Dn;

a gate of the third transistor T3 is electrically connected with a third signal end RST, and a drain of the third transistor T3 is electrically connected with a fourth signal end Dbias; and the transmitting electrode pad is electrically connected with a control IC at a point B through a transmitting lead 126.

The first transistor T1, the second transistor T2, and the third transistor T3 may each specifically include an active layer (the active layer may specifically include a channel region 121, a doped source region 1211 located on one side of the channel region 121, and a doped drain region 1212 located on the other side of the channel region 121), a first insulating layer 14 located on the active layer, a gate 122 located on the insulating layer 14, a second insulating layer 15 located on the gate 122, a source-drain layer located on the second insulating layer 15 (the source-drain layer may specifically include a source 123 electrically connected with the doped source region 1211, a drain 124 electrically connected with the doped drain region 1212, an intermediate electrode 125 for electrically connecting the first electrode pad 131 with the gate 122, and a transmitting lead 126), and a third insulating layer 16 located on the source-drain layer. The first transistor T1 may be a source follower and the second transistor T2 may be a control switch.

Figure 8:
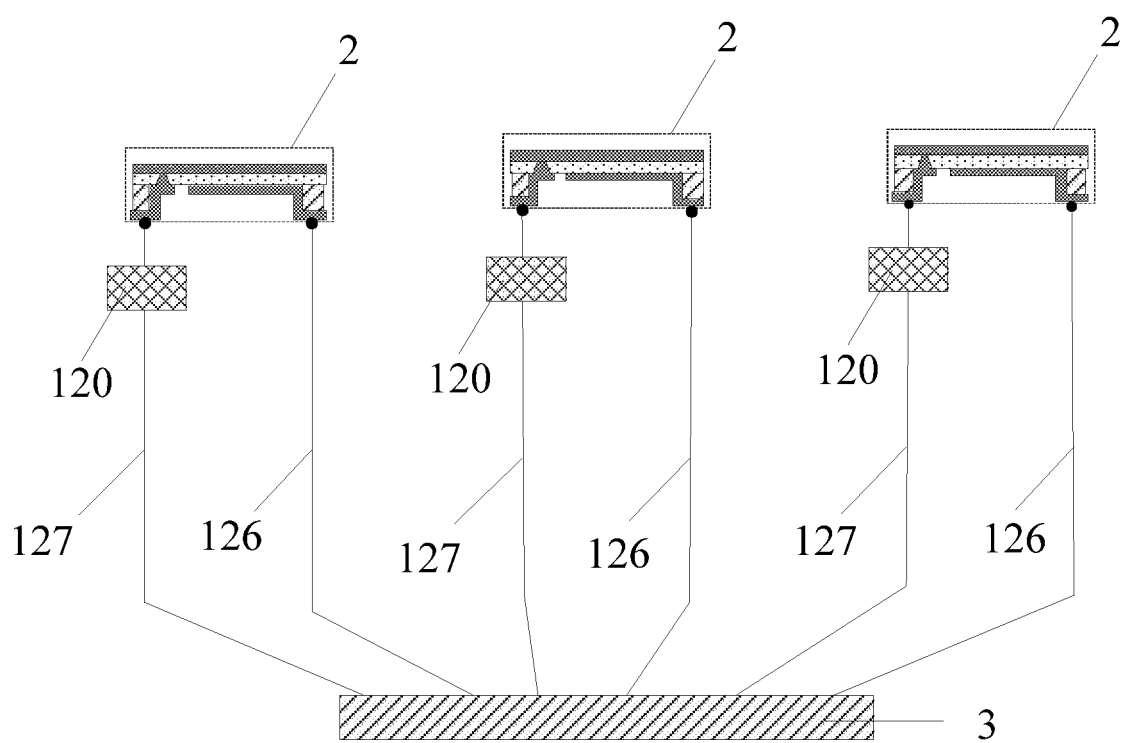
FIG. 8 is a schematic diagram of a connection relationship between acoustic units and a control IC according to the embodiments of the present disclosure.

During specific implementation, as shown in FIG. 8, the fingerprint identification module further includes a control IC 3, transmitting traces 126, and receiving traces 127. The first electrode pads 131 are receiving electrode pads and the second electrode pads 132 are transmitting electrode pads. The receiving electrode pads are electrically connected with the control IC 3 through the thin film transistor switching circuits 120 via the receiving traces 127, and the transmitting electrode pads are electrically connected with the control IC 3 via the transmitting traces 126. In the embodiments of the present disclosure, the receiving electrode pads are electrically connected with the control IC 3 through the identification circuits 12 via the receiving traces 127. The signals obtained during fingerprint identification through acoustic transmission and reception are generally weak, by using the identification circuits 12 to amplify the received signals, the problem that fingerprints cannot be accurately identified when the received signals are weak can be avoided.

Figure 9:
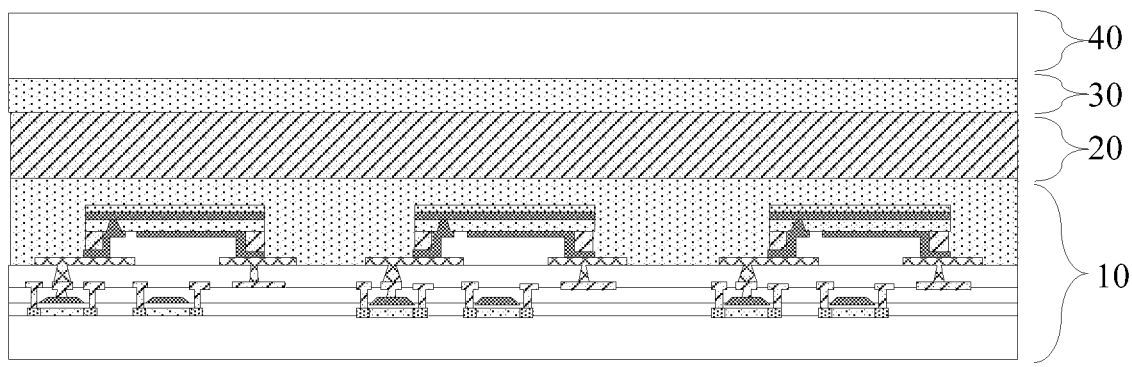
FIG. 9 is a structural diagram of a display device according to the embodiments of the present disclosure.

Based on the same inventive concept, referring to FIG. 9, the embodiments of the present disclosure also provide a display device, including the fingerprint identification module 10 provided in the embodiments of the present disclosure, and further including a display panel 20. The fingerprint identification module 10 is located on a non-display surface of the display panel 20, that is, as shown in FIG. 9, the upper surface of the display panel 20 is a display surface and the lower surface is the non-display surface, and the fingerprint identification module 10 is located on the lower surface of the display panel 20. The side, facing away from the fingerprint identification module 10, of the display panel 20 may also be provided with a protective cover 40, and the protective cover 40 may be attached to the display panel 20 through an optical adhesive 30.

Based on the same inventive concept, the embodiments of the present disclosure also provide a manufacturing method of the fingerprint identification module according to the embodiments of the present disclosure, wherein the manufacturing method includes:

S100: a driving backplate is formed, wherein the driving backplate includes a substrate and a plurality of identification circuits positioned on the substrate, and each identification circuit has a first electrode pad and a second electrode pad;

S200: a plurality of acoustic units are formed on a carrier substrate, wherein each acoustic unit includes a first lead-out terminal and a second lead-out terminal. The carrier substrate may specifically be a silicon-based substrate;

S300: the acoustic units on the carrier substrate are transferred to the driving backplate, the first electrode pads are electrically connected with the first lead-out terminals, the second electrode pads are electrically connected with the second lead-out terminals, and cavities are formed between second electrodes and the substrate, wherein one side face, away from the substrate, of each cavity is defined by at least one side face, close to the substrate, of the corresponding second electrode. Specifically, the acoustic units can be transferred to the driving backplate through transfer printing, and please refer to the transfer printing process of MICRO or MINILED for the specific transfer printing process.

During specific implementation, the formation of the acoustic units, that is, the formation of the plurality of acoustic units on the carrier substrate in S200 includes:

S201: a first electrode and a piezoelectric film layer are sequentially formed on the carrier substrate, and a through hole is formed in the piezoelectric film layer;

S202: a second electrode and a first lead-out terminal are formed on the side, away from the first electrode, of the piezoelectric film layer, wherein the second electrode and the first lead-out terminal do not overlap, and the first lead-out terminal is electrically connected with the first electrode through a first connecting portion filled in the through hole, and the second electrode, the first lead-out terminal and the first connecting portion are formed by one patterning process.

During specific implementation, the cavities may be formed by forming support portions when forming the acoustic units, that is, before forming the second electrode and the first lead-out terminal on the side, away from the first electrode, of the piezoelectric film layer in S202, the manufacturing method further includes:

S203: the support portion is formed on the side, away from the first electrode, of the piezoelectric film layer, so as to form the cavity between the piezoelectric film layer and the driving backplate when the acoustic unit is transferred to the driving backplate.

During specific implementation, the cavities may be formed by forming support portions when forming the driving backplate, that is, the formation of the driving backplate in S100 includes:

S110: before forming the first electrode pads and the second electrode pads on the substrate, a plurality of support portions are formed on the substrate, so as to form the cavity between the piezoelectric film layers and the driving backplate when transferring the acoustic units to the driving backplate.

During specific implementation, the cavities may be formed by forming grooves in the driving backplate, that is, the formation of the driving backplate in S100 includes:

S121: a plurality of grooves are formed in the substrate, so as to form the cavities between the piezoelectric film layers and the driving backplate when the acoustic units are transferred to the driving backplate; and S122: a plurality of identification circuits are formed in other regions of the substrate except the regions where the grooves are located.

In order to understand the present disclosure more clearly, different methods for forming the cavities of the fingerprint identification module will be illustrated below with reference to FIGS. 10-25.

Figure 10:
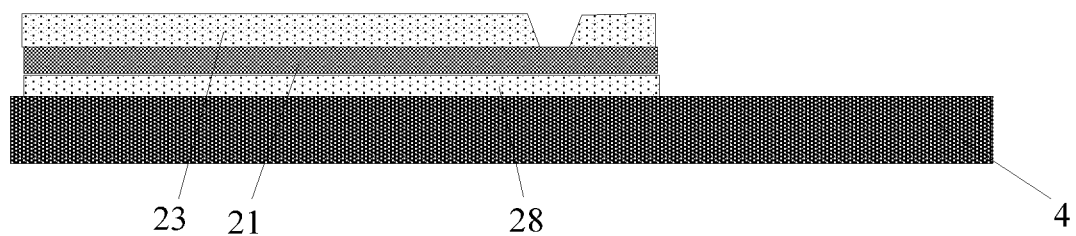
FIG. 10 is a first structural diagram of forming a piezoelectric film layer on a carrier substrate according to the embodiments of the present disclosure.
Figure 11:
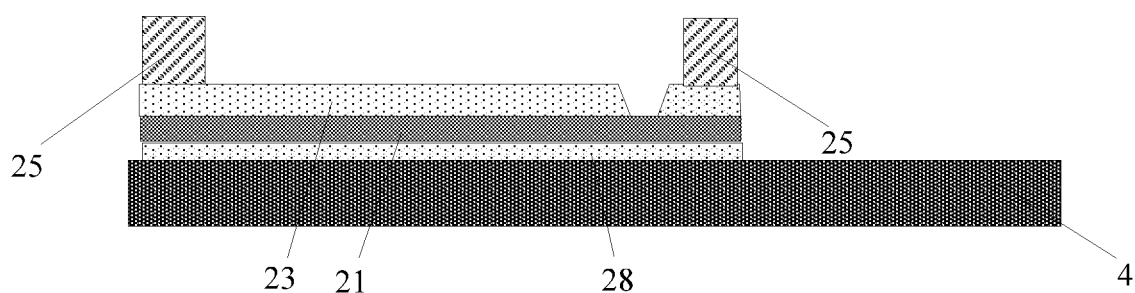
FIG. 11 is a first structural diagram of forming support portions on a carrier substrate according to the embodiments of the present disclosure.
Figure 12:
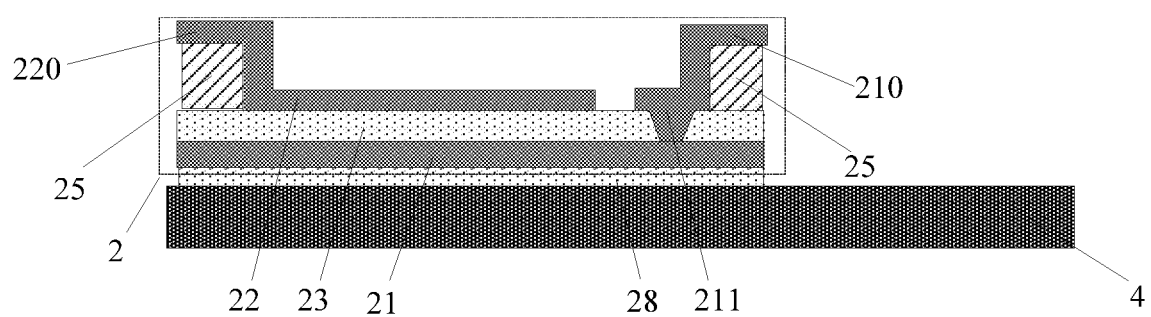
FIG. 12 is a first structural diagram of forming a second electrode on a carrier substrate according to the embodiments of the present disclosure.
Figure 13:
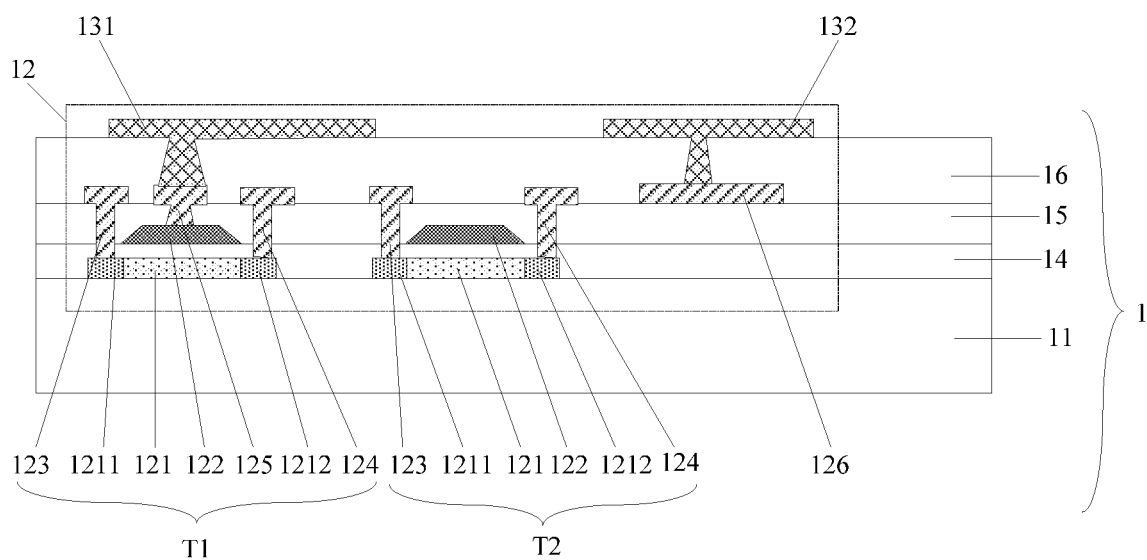
FIG. 13 is a first structural diagram of forming identification circuits on a substrate according to the embodiments of the present disclosure.
Figure 14:
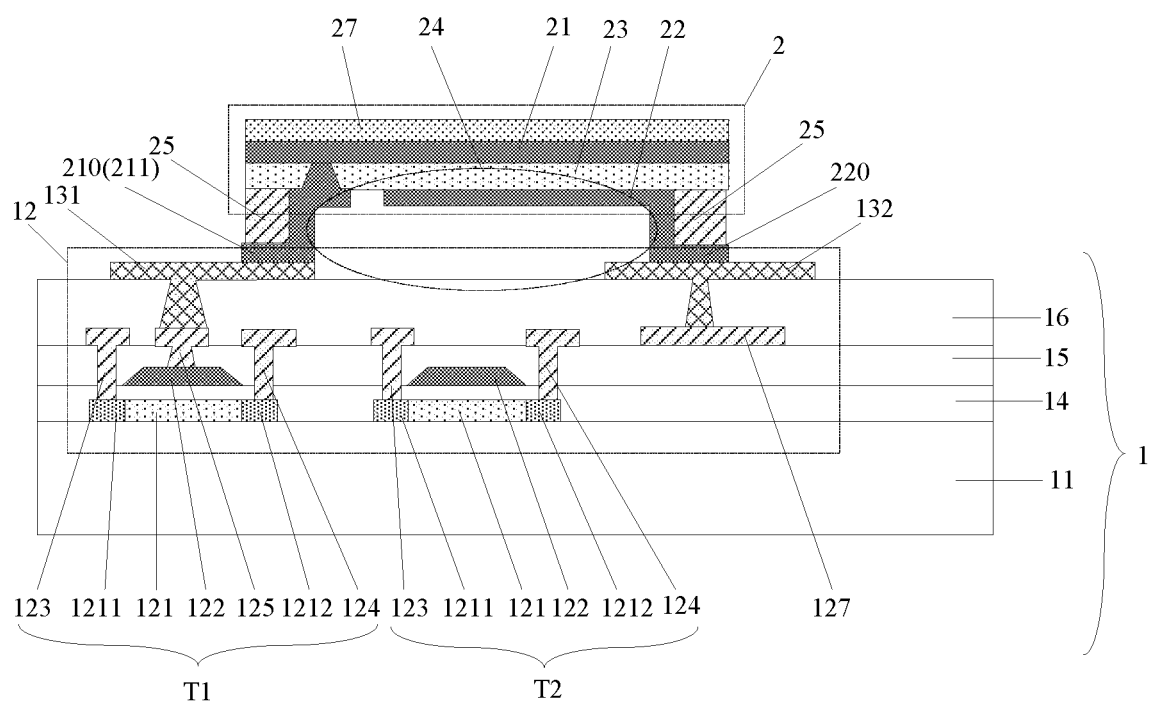
FIG. 14 is a first structural diagram of transferring acoustic units to a driving backplate according to the embodiments of the present disclosure.

The cavities are formed by forming support portions on the acoustic units:

Step 1: a separation layer 28 (the separation layer 28 can be specifically used as a separation film layer for separating the acoustic units 2 from a carrier substrate 4 later, i.e., the acoustic units 2 are separated from the carrier substrate 4 by performing, for example, heat treatment or light treatment on the separation layer 28), a first electrode 21 and a piezoelectric film layer 23 are sequentially formed on the carrier substrate 4, and a through hole is formed at a set position of the piezoelectric film layer 23, wherein the structural diagram of forming the through hole in the piezoelectric film layer 23 of the carrier substrate 4 is shown in FIG. 10;

Step 2: an annular support portion 25 is formed on the side, away from the first electrode 21, of the piezoelectric film layer 23, wherein the support portion 25 allows the cavity 24 to be formed between the second electrode 22 and part of the driving backplate 1 opposite thereto when the acoustic unit 2 is transferred to the driving backplate 1 later, and the structural diagram of forming the support portion 25 on the carrier substrate 4 is shown in FIG. 11;

Step 3: a second electrode 22, a first lead-out terminal 210 and a first connecting portion 211 are formed on the side, away from the first electrode 21, of the piezoelectric film layer 23, wherein the second electrode 22 and the first lead-out terminal 210 do not overlap, the first lead-out terminal 210 is electrically connected with the first electrode 21 through the first connecting portion 211 filled in the through hole, part of the second electrode 22 serves as the second lead-out terminal 220, the structure in which the first electrode 21, the second electrode 22, the piezoelectric film layer 23, the first lead-out terminal 210, the second lead-out terminal 220, and the support portion 25 are formed is taken as the acoustic unit 2, and the structural diagram of forming the second electrode 22 on the carrier substrate 4 is shown in FIG. 12;

Step 4: a plurality of transistors (including a first transistor T1, a second transistor T2, and a third transistor T3) are formed on the substrate 11 (specifically, a glass substrate), and a first electrode pad 131 and a second electrode pad 132 electrically connected with the transistors are formed on the side, away from the substrate 11, of the transistors, wherein the structure including the substrate 11, the first electrode pads 131, the second electrode pads 132, and the transistors is taken as the driving backplate 1, and the structural diagram of forming the first electrode pad and the second electrode pad on the substrate is shown in FIG. 13;

Step 5: the acoustic unit 2 is separated from the carrier substrate 4, the acoustic unit 2 of the carrier substrate 4 is transferred to the driving backplate 1, the first electrode pad 131 is electrically connected with the first lead-out terminal 210, the second electrode pad 132 is electrically connected with the second lead-out terminal 220, and the cavity 24 is formed between the second electrode 22 and part of the driving backplate 1 opposite thereto, wherein the structural diagram after the acoustic unit 2 is transfer-printed to the driving backplate 1 is shown in FIG. 14.

Figure 15:
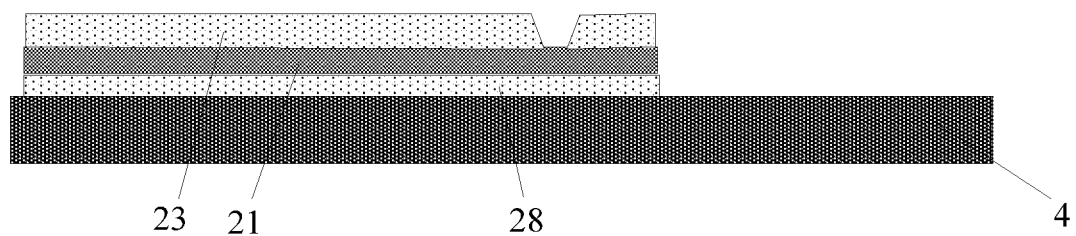
FIG. 15 is a second structural diagram of forming a piezoelectric film layer on a carrier substrate according to the embodiments of the present disclosure.
Figure 16:
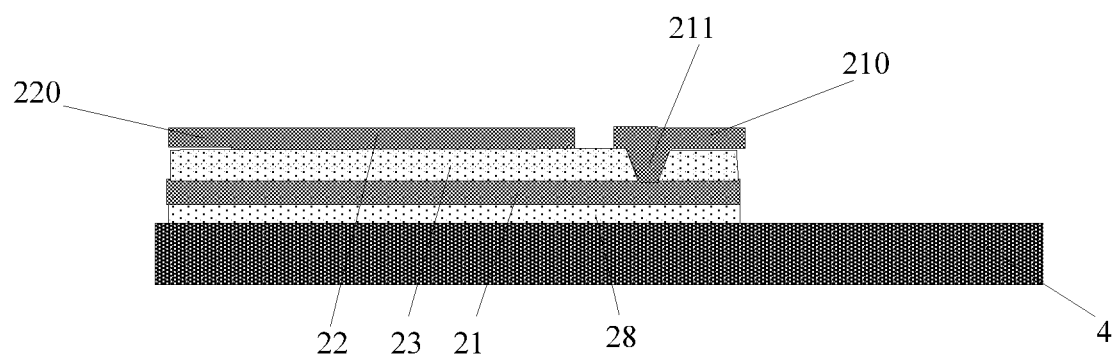
FIG. 16 is a second structural diagram of forming a second electrode on a carrier substrate according to the embodiments of the present disclosure.
Figure 17:
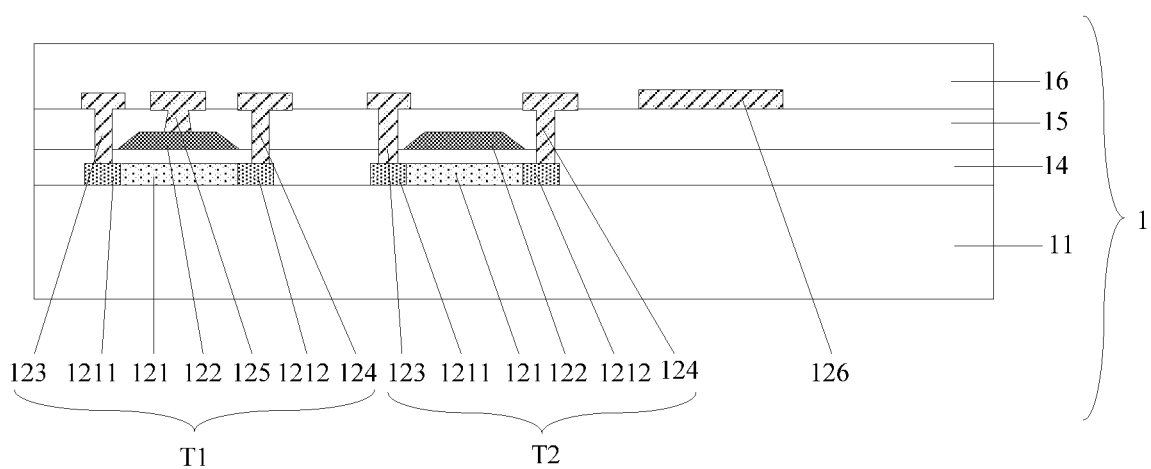
FIG. 17 is a second structural diagram of forming transistors on a substrate according to the embodiments of the present disclosure.
Figure 18:
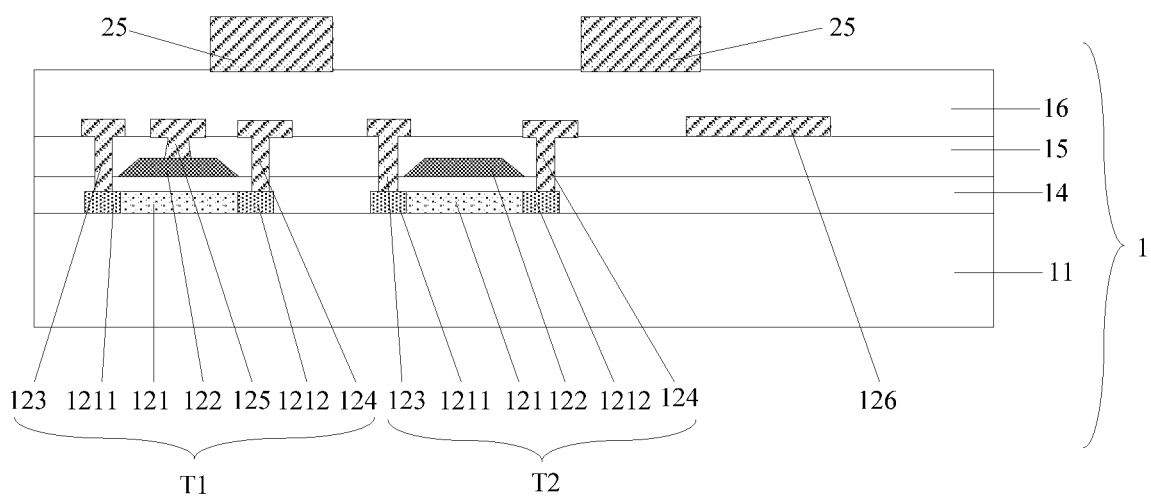
FIG. 18 is a second structural diagram of forming support portions on a substrate according to the embodiments of the present disclosure.
Figure 19:
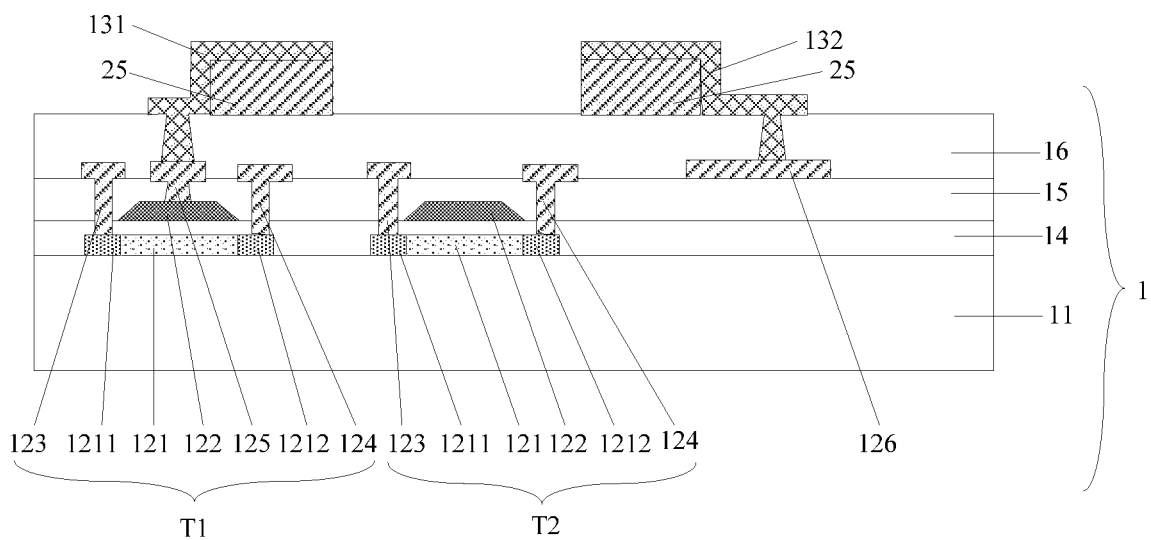
FIG. 19 is a second structural diagram of forming a second electrode on a substrate according to the embodiments of the present disclosure.
Figure 20:
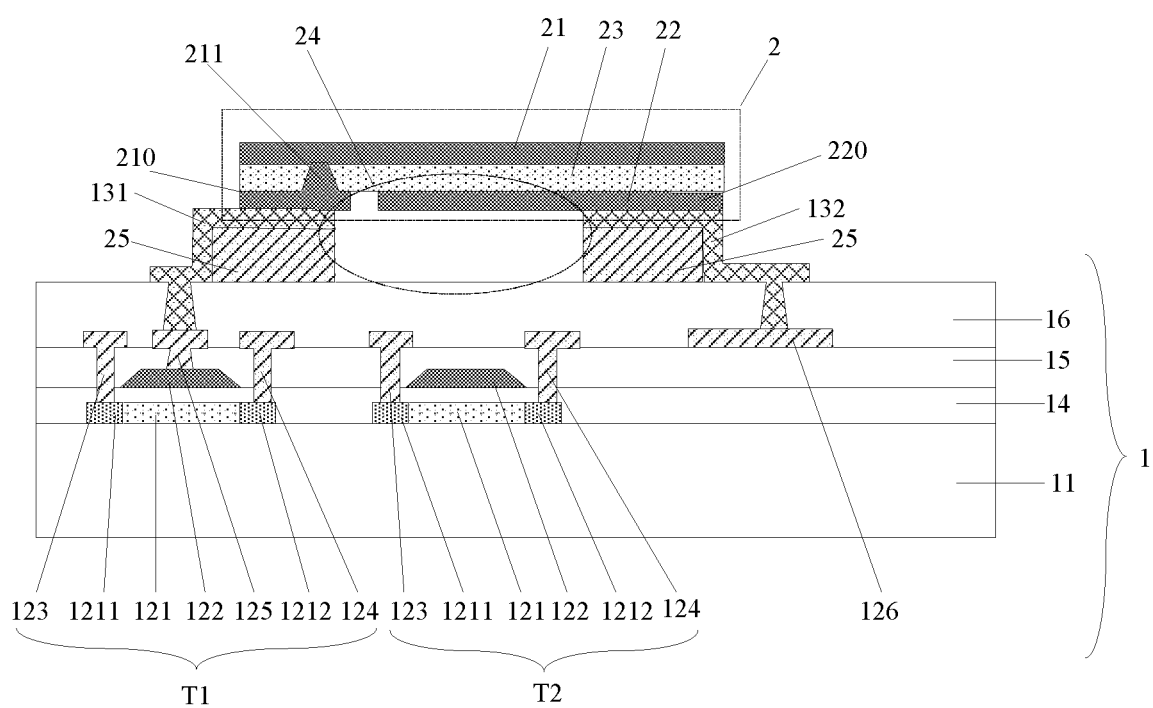
FIG. 20 is a second structural diagram of transferring acoustic units to a driving backplate according to the embodiments of the present disclosure.

The cavities 24 are formed by forming support portions 25 on the driving backplate 1:

Step 1: a separation layer 28 (the separation layer 28 can be specifically used as a separation film layer for separating the acoustic units 2 from a carrier substrate 4 later, i.e., the acoustic units 2 are separated from the carrier substrate 4 by performing heat treatment or light treatment on the separation layer 28), a first electrode 21 and a piezoelectric film layer 23 are sequentially formed on the carrier substrate 4, and a through hole is formed at a set position of the piezoelectric film layer 23, wherein the structural diagram of forming the through hole in the piezoelectric film layer 23 of the carrier substrate 4 is shown in FIG. 15;

Step 2: a second electrode 22, a first lead-out terminal 210 and a first connecting portion 211 are formed on the side, away from the first electrode 21, of the piezoelectric film layer 23, wherein the second electrode 22 and the first lead-out terminal 210 do not overlap, the first lead-out terminal 210 is electrically connected with the first electrode 21 through the first connecting portion 211 filled in the through hole, part of the second electrode 22 serves as the second lead-out terminal 220, the structure in which the first electrode 21, the second electrode 22, the piezoelectric film layer 23, the first lead-out terminal 210 and the second lead-out terminal 220 are formed is taken as the acoustic unit 2, and the structural diagram of forming the second electrode 22 on the carrier substrate 4 is shown in FIG. 16;

Step 3: a plurality of transistors (including a first transistor T1, a second transistor T2, and a third transistor T3) are formed on the substrate 11 (specifically, a glass substrate), wherein the structural diagram of forming the plurality of transistors on the substrate 11 (specifically, a glass substrate) is shown in FIG. 17;

Step 4: a plurality of annular support portions 25 are formed on the side, away from the substrate 11, of the transistors, so that when the acoustic units 2 are transferred to the driving backplate 1, the support portions 25 allow the cavities 24 to be formed between the second electrodes 22 of the acoustic units 2 and part of the driving backplate 1 opposite thereto, and the structural diagram of forming the support portions 25 on the substrate 11 is shown in FIG. 18;

Step 5: a first electrode pad 131 and a second electrode pad 132 electrically connected with the transistors are formed on the side, away from the substrate 11, of the support portion 25, wherein the structure including the first electrode pad 131, the second electrode pad 132, the transistors and the support portion 25 are taken as the identification circuit 12, and the structural diagram of forming the first electrode pad 131 and the second electrode pad 132 on the substrate 11 is shown in FIG. 19;

Step 6: the acoustic unit 2 is separated from the carrier substrate 4, the acoustic unit 2 of the carrier substrate 4 is transferred to the driving backplate 1, the first electrode pad 131 is electrically connected with the first lead-out terminal 210, the second electrode pad 132 is electrically connected with the second lead-out terminal 220, and the cavity 24 is formed between the second electrode 22 and part of the driving backplate 1 opposite thereto, wherein the structural diagram after the acoustic unit 2 is transfer-printed to the driving backplate 1 is shown in FIG. 20.

Figure 21:
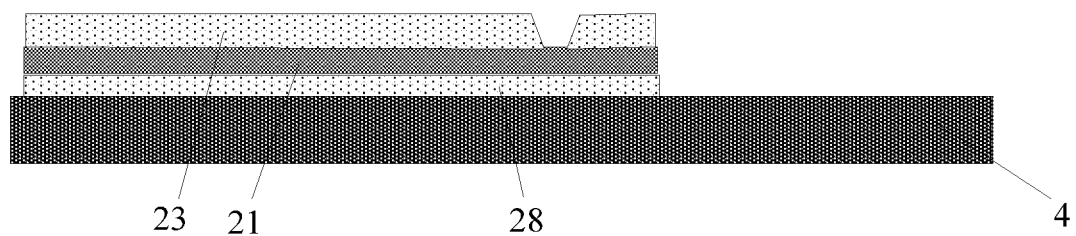
FIG. 21 is a third structural diagram of forming a piezoelectric film layer on a carrier substrate according to the embodiments of the present disclosure.
Figure 22:
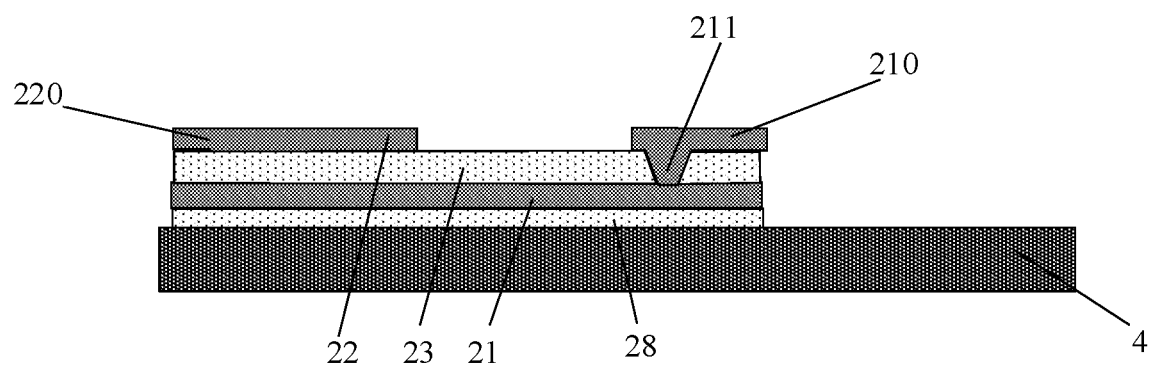
FIG. 22 is a third structural diagram of forming a second electrode on a carrier substrate according to the embodiments of the present disclosure.
Figure 23:
FIG. 23 is a third structural diagram of forming grooves in a substrate according to the embodiments of the present disclosure.
Figure 24:
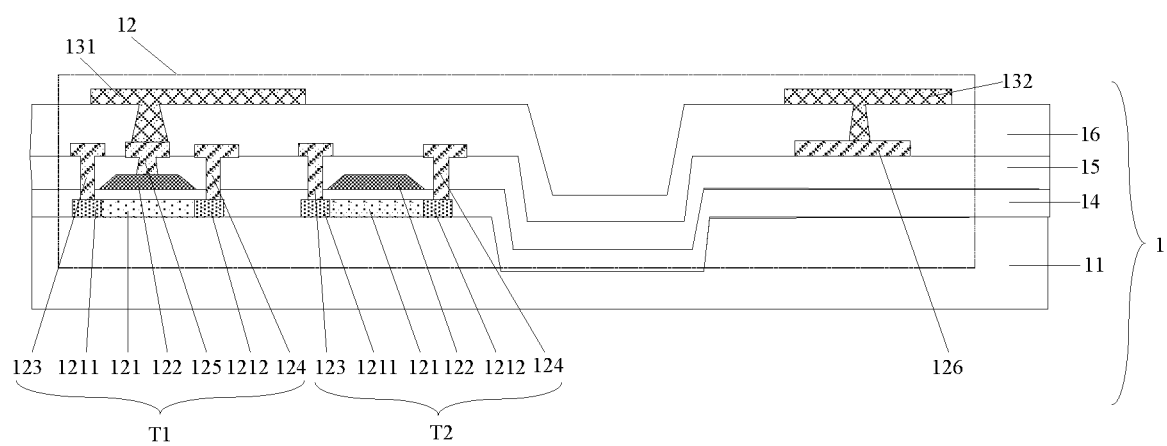
FIG. 24 is a third structural diagram of forming identification circuits on a substrate according to the embodiments of the present disclosure.
Figure 25:
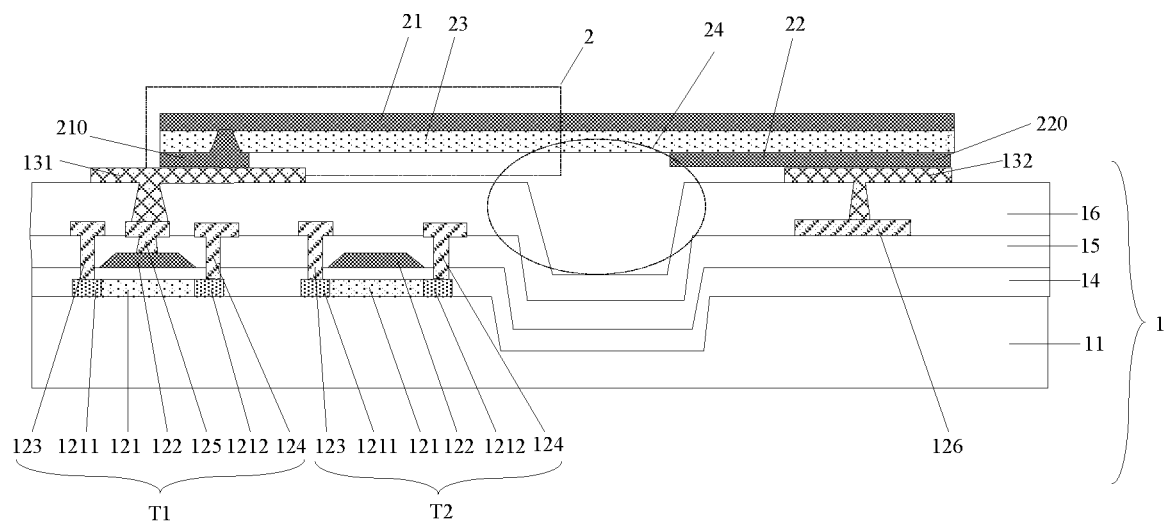
FIG. 25 is a third structural diagram of transferring acoustic units to a driving backplate according to the embodiments of the present disclosure.

The cavities are formed by forming grooves in the driving backplate:

Step 1: a separation layer 28 (the separation layer 28 can be specifically used as a separation film layer for separating the acoustic units 2 from a carrier substrate 4 later, i.e., the acoustic units 2 are separated from the carrier substrate 4 by performing heat treatment or light treatment on the separation layer 28), a first electrode 21 and a piezoelectric film layer 23 are sequentially formed on the carrier substrate 4, and a through hole is formed at a set position of the piezoelectric film layer 23, wherein the structural diagram of forming the through hole in the piezoelectric film layer 23 of the carrier substrate 4 is shown in FIG. 21;

Step 2: a second electrode 22, a first lead-out terminal 210 and a first connecting portion 211 are formed on the side, away from the first electrode 21, of the piezoelectric film layer 26, wherein the second electrode 22 and the first lead-out terminal 210 do not overlap, the first lead-out terminal 210 is electrically connected with the first electrode 21 through the first connecting portion 211 filled in the through hole, part of the second electrode 22 serves as the second lead-out terminal 220, the structure in which the first electrode 21, the second electrode 22, the piezoelectric film layer 23, the first lead-out terminal 210 and the second lead-out terminal 220 are formed is taken as the acoustic unit 2, and the structural diagram of forming the second electrode 22 on the carrier substrate 4 is shown in FIG. 22;

Step 3: a plurality of grooves are formed in the substrate 11 (specifically, a glass substrate) (FIG. 28 only illustrates one groove, but the present disclosure is not limited thereto), so that when the acoustic unit 2 is transferred to the driving backplate 1, the groove allows the cavity 24 to be formed between the second electrode 22 of the acoustic unit 2 and part of the driving backplate 1 opposite thereto, and the structural diagram of forming the plurality of grooves in the substrate 22 is shown in FIG. 23;

Step 4: a plurality of identification circuits 12 are formed in other areas of the substrate 11 except the areas where the grooves are located, wherein each identification circuit 12 may specifically include transistors, and a first electrode pad 131 and a second electrode pad 132 electrically connected with the transistors, and the structural diagram of forming the identification circuits 12 on the substrate 11 is shown in FIG. 24;

Step 5: the acoustic unit 2 is separated from the carrier substrate 4, the acoustic unit 2 of the carrier substrate 4 is transferred to the driving backplate 1, the first electrode pad 21 is electrically connected with the first lead-out terminal 210, the second electrode pad 132 is electrically connected with the second lead-out terminal 220, and the cavity 24 is formed between the second electrode 22 and part of the driving backplate 1 opposite thereto, wherein the structural diagram after the acoustic unit 2 is transfer-printed to the driving backplate 1 is shown in FIG. 25.

Figure 26:
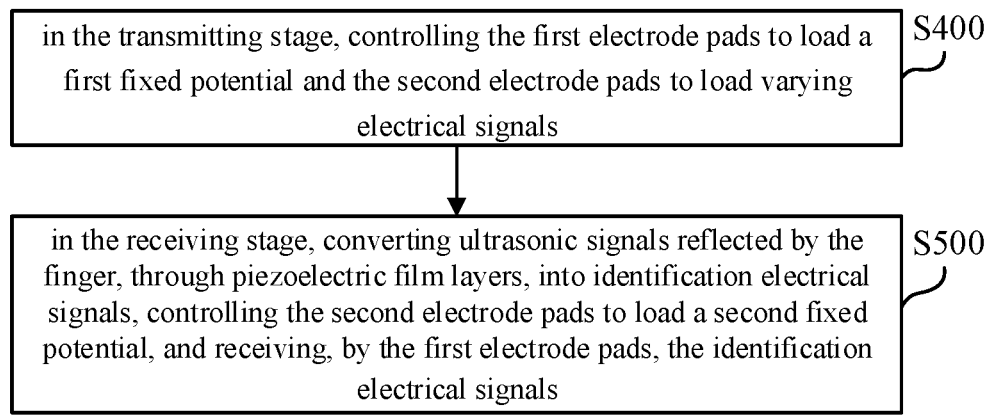
FIG. 26 is a flowchart of a driving method of a fingerprint identification module according to the embodiments of the present disclosure.

Based on the same inventive concept, the embodiments of the present disclosure also provide a driving method of the fingerprint identification module according to the embodiments of the present disclosure, as shown in FIG. 26, the driving method includes:

S400: in the transmitting stage, first electrode pads are controlled to load a first fixed potential and second electrode pads are controlled to load varying electrical signals;

S500: in the receiving stage, ultrasonic signals reflected by the finger, by piezoelectric film layers, are converted into identification electrical signals, the second electrode pads are controlled to load a second fixed potential, and the identification electrical signals are received by the first electrode pads.

Figure 27:
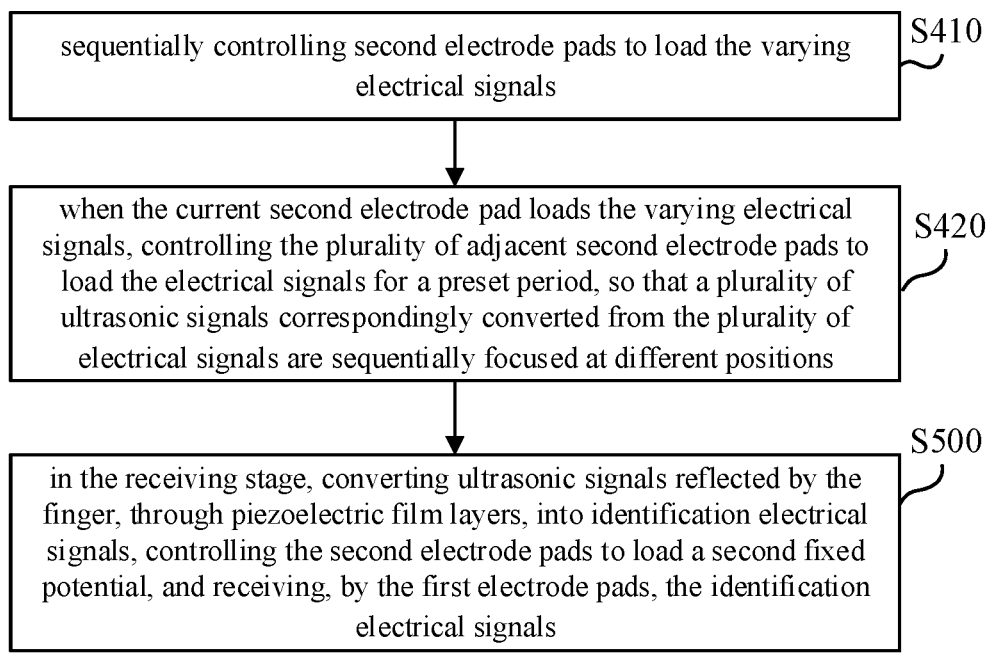
FIG. 27 is a flowchart of a driving method of a specific fingerprint identification module according to the embodiments of the present disclosure.

Referring to FIG. 27, the controlling of the second electrode pads to load the varying electrical signals in S400 includes:

S410: each second electrode pad is sequentially controlled to load the varying electrical signals;

S420: when the current second electrode pad loads the varying electrical signals, the plurality of adjacent second electrode pads are controlled to load the electrical signals before a preset period, so that a plurality of ultrasonic signals correspondingly converted from the plurality of electrical signals are sequentially focused at different positions.

Figure 28:
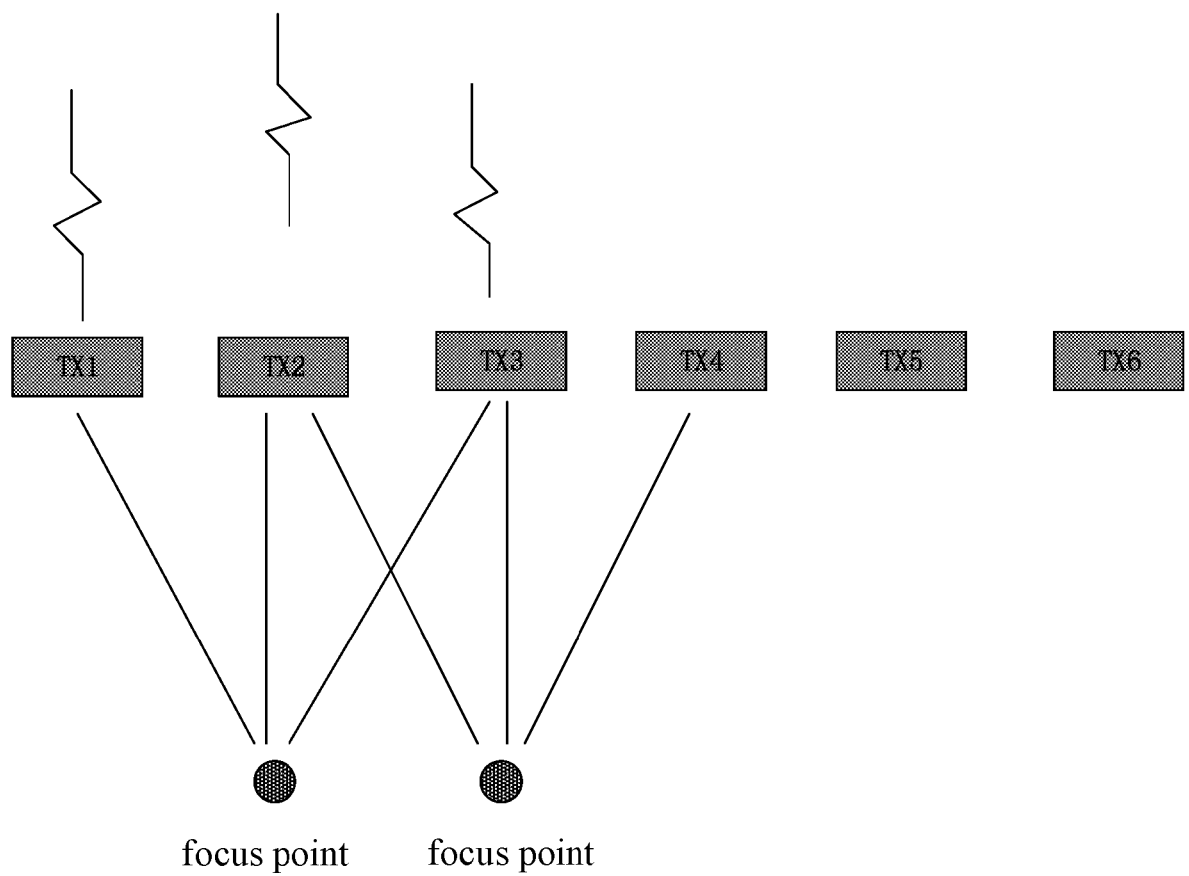
FIG. 28 is a schematic diagram of transmitting electrodes emitting acoustic waves sequentially in one direction according to the embodiments of the present disclosure.
Figure 29:
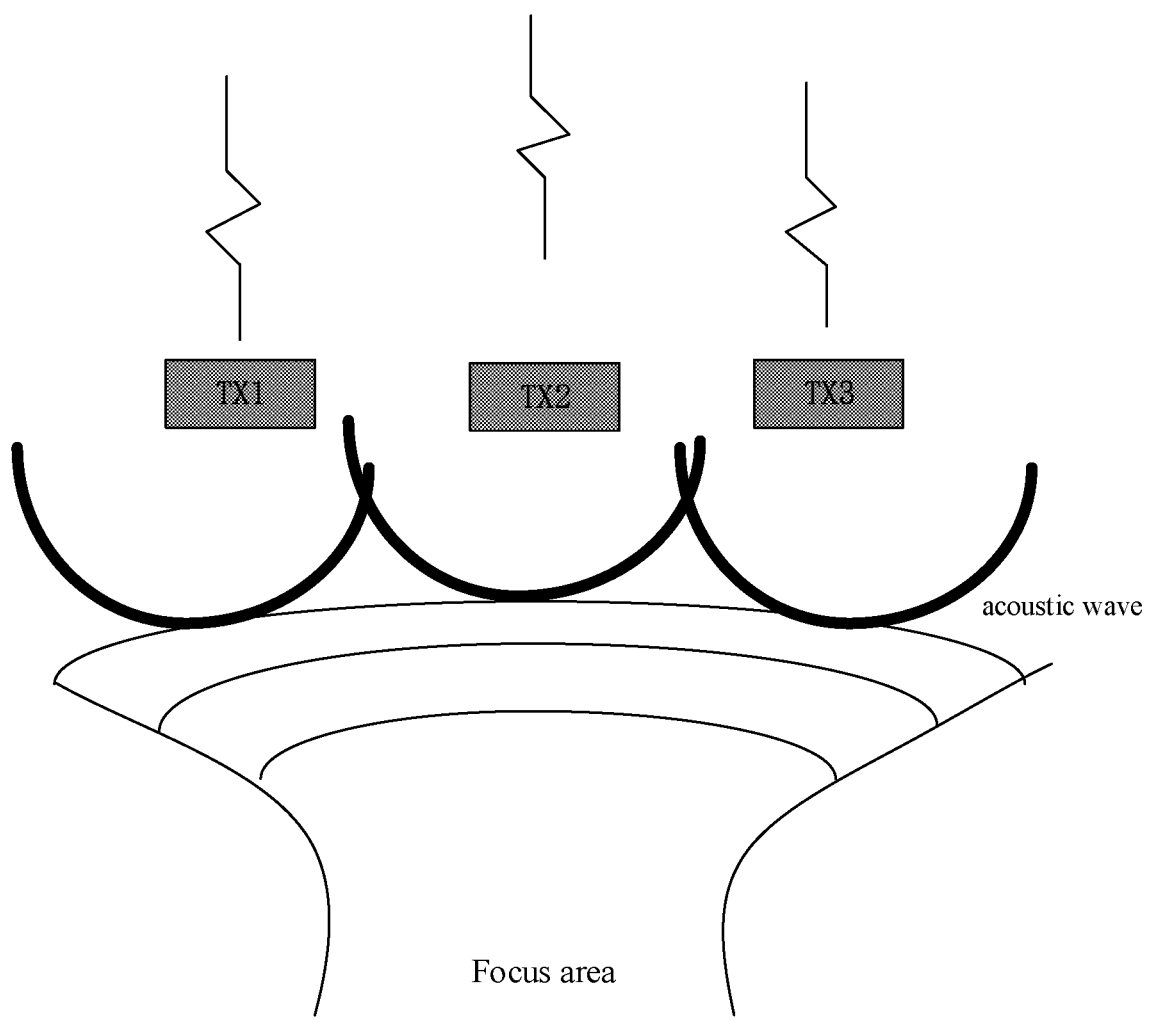
FIG. 29 is a schematic diagram of transmitting electrodes focusing in one direction according to the embodiments of the present disclosure.
Figure 30:
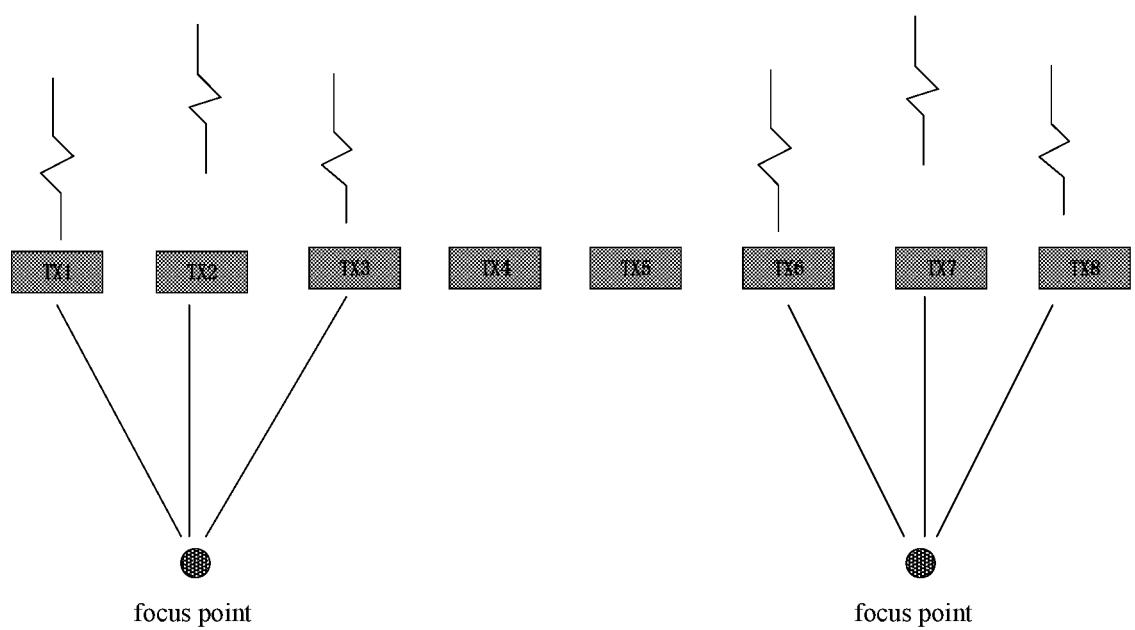
FIG. 30 is a schematic diagram of transmitting electrodes emitting acoustic waves sequentially in two directions according to the embodiments of the present disclosure.

Referring to FIGS. 28-30, the main focusing principle of the driving method provided in the embodiments of the present disclosure will be described below (described in one-dimensional direction).

Referring to FIGS. 28 and 29, Tx1, Tx2 and Tx3 are taken as a group of transmitting electrodes, and signals are focused at a position directly above TX2. This requires Tx1 and Tx3 to transmit excitation waves first, and Tx2 to transmit ultrasonic waves after that. The phase wave of Tx2 is delayed compared with Tx1 and Tx3, so that signals can be focused directly above Tx2, with increased energy and enhanced directivity. Tx2, Tx3 and Tx4 are taken as a second group of Tx transmission sources when it is desired to focus on adjacent points.

During specific implementation, as shown in FIG. 30, two or more electrodes can be taken as a group of transmission sources for focusing line by line, or multiple groups of transmission sources can conduct transmission simultaneously (without affecting each other). For example, focusing is conducted from both ends at the same time. This can reduce identification time. By adopting the focusing method, directivity is stronger and valley-ridge crosstalk is reduced.

Although the preferred embodiments of the present disclosure have been described, those skilled in the art can make additional changes and modifications to these embodiments once they know the basic inventive concepts. Therefore, the appended claims are intended to be interpreted as including the preferred embodiments and all changes and modifications that fall within the scope of the present disclosure.

Obviously, those skilled in the art can make various changes and modifications to the embodiments of the present disclosure without departing from the spirit and scope of the embodiments of the present disclosure. Thus, if these modifications and variations of the embodiments of the present disclosure fall within the scope of the claims of the present disclosure and their equivalents, the present disclosure is also intended to include these modifications and variations.

The invention claimed is:

1. A fingerprint identification module, comprising:
    a driving backplate, comprising a substrate and a plurality of identification circuits positioned on the substrate, the identification circuits having a first electrode pad and a second electrode pad;
    a plurality of acoustic units, the acoustic units being in one-to-one correspondence to the identification circuits, and the acoustic units comprising: a first electrode; a piezoelectric film layer positioned on a side, close to the driving backplate, of the first electrode; a second electrode positioned on a side, close to the driving backplate, of the piezoelectric film layer; a first lead-out terminal electrically connected with the first electrode; and a second lead-out terminal electrically connected with the second electrode; the first lead-out terminals being electrically connected with the first electrode pads, and the second lead-out terminals being electrically connected with the second electrode pads; and
    a plurality of cavities, the cavities being in one-to-one correspondence to the acoustic units, the cavities being positioned between the second electrodes and the substrate, and one side face, away from the substrate, of the cavities being defined by at least one side face, close to the substrate, of the second electrode.

2. The fingerprint identification module according to claim 1, wherein a support portion is arranged between the piezoelectric film layer and the substrate; and in a direction perpendicular to the substrate, a highest height of the cavity is equal to a sum of heights of the first electrode pad, the first lead-out terminal and the support portion.

3. The fingerprint identification module according to claim 2, wherein the support portion is located between the piezoelectric film layer and a layer where the first lead-out terminal is located.

4. The fingerprint identification module according to claim 2, wherein the support portion is located between the substrate and a layer where the first electrode pad is located.

5. The fingerprint identification module according to claim 2, wherein the substrate is provided with grooves, and side walls of the grooves serve as the support portions.

6. The fingerprint identification module according to claim 1, wherein a side face, away from the substrate, of the cavities is at least defined by a side face, close to the substrate, of the piezoelectric film layer.

7. The fingerprint identification module according to claim 2, wherein the support portions are annular support portions.

8. The fingerprint identification module according to claim 1, wherein the cavities are filled with air or elastic filler.

9. The fingerprint identification module according to claim 2, wherein the acoustic unit further comprise a through hole penetrating through the corresponding piezoelectric film layer, the through hole is filled with a first connecting portion, and the first lead-out terminal is electrically connected with the first electrode through the first connecting portion.

10. The fingerprint identification module according to claim 9, wherein a part of the second electrode is reused as the second lead-out terminal; the first connecting portion, the first lead-out terminal, and the second electrode are disposed on a same layer.

11. The fingerprint identification module according to claim 1, wherein the acoustic unit further comprise an elastic layer located on a side, facing away from the piezoelectric film layer, of the first electrode.

12. The fingerprint identification module according to claim 1, wherein the piezoelectric film layer is an inorganic piezoelectric film layer made of aluminum nitride, zinc oxide or lead zirconate titanate.

13. The fingerprint identification module according to claim 1, further comprises a control IC, transmitting traces and receiving traces, the first electrode pads are receiving electrode pads, and the second electrode pads are transmitting electrode pads; and
    the receiving electrode pads are electrically connected with the control IC through thin film transistor switching circuits via the receiving traces, and the transmitting electrode pads are electrically connected with the control IC via the transmitting traces.

14. A display device, comprising the fingerprint identification module according to claim 1, and further comprising a display panel; and
    the fingerprint identification module being located on a non-display surface of the display panel.

15. A manufacturing method of the fingerprint identification module according to claim 1, wherein the manufacturing method comprises:
    forming a driving backplate, wherein the driving backplate comprises a substrate and a plurality of identification circuits positioned on the substrate, and the identification circuits comprise a first electrode pad and a second electrode pad;

forming a plurality of acoustic units on a carrier substrate, wherein the acoustic unit comprise a first lead-out terminal and a second lead-out terminal; and transferring the acoustic units on the carrier substrate to the driving backplate, electrically connecting the first electrode pads with the first lead-out terminals, electrically connecting the second electrode pads with the second lead-out terminals, and forming cavities between second electrodes and the substrate, wherein one side face, away from the substrate, of the cavities is defined by at least one side face, close to the substrate, of the second electrode.

16. The manufacturing method according to claim 15, wherein the forming the plurality of acoustic units on the carrier substrate comprises:

sequentially forming a first electrode and a piezoelectric film layer on the carrier substrate, and forming a through hole in the piezoelectric film layer; and forming the second electrode and the first lead-out terminal on a side, away from the first electrode, of the piezoelectric film layer, wherein the second electrode and the first lead-out terminal do not overlap, and the first lead-out terminal is electrically connected with the first electrode through a first connecting portion filled in the through hole;

wherein the second electrode, the first lead-out terminal and the first connecting portion are formed by a same patterning process.

17. The manufacturing method according to claim 15, wherein before the forming the second electrode and the first lead-out terminal on the side, away from the first electrode, of the piezoelectric film layer, the manufacturing method further comprises:

forming a support portion on a side, away from the first electrode, of the piezoelectric film layer, so as to form the cavities between the piezoelectric film layers and the driving backplate when the acoustic unit is transferred to the driving backplate.

18. The manufacturing method according to claim 15, wherein the forming the driving backplate comprises:

before forming the first electrode pads and the second electrode pads on the substrate, forming a plurality of support portions on the substrate, so as to form the cavities between the piezoelectric film layers and the driving backplate when the acoustic units are transferred to the driving backplate.

19. The manufacturing method according to claim 15, wherein the forming the driving backplate comprises:

forming a plurality of grooves in the substrate, so as to form the cavities between the piezoelectric film layers and the driving backplate when the acoustic units are transferred to the driving backplate; and forming a plurality of identification circuits in other regions of the substrate except regions where the grooves are located.

20. A driving method of the fingerprint identification module according to claim 1, wherein the driving method comprises:

in a transmitting stage, controlling the first electrode pads to load a first fixed potential and the second electrode pads to load varying electrical signals; and in a receiving stage, converting ultrasonic signals reflected by a finger, through the piezoelectric film layers, into identification electrical signals, controlling the second electrode pads to load a second fixed potential, and receiving, by the first electrode pads, the identification electrical signals;

and the controlling the second electrode pads to load the varying electrical signals comprises:

sequentially controlling the second electrode pads to load the varying electrical signals; and when a current second electrode pad loads the varying electrical signals, controlling the plurality of adjacent second electrode pads to load the electrical signals before a preset period, so that a plurality of ultrasonic signals correspondingly converted from the plurality of electrical signals are sequentially focused at different positions.

\* \* \* \* \*